(12) United States Patent
Martínez Vela et al.

(10) Patent No.: US 12,415,422 B2
(45) Date of Patent: Sep. 16, 2025

(54) VEHICLE INTERIOR WITH A RETRACTABLE FLEXIBLE DISPLAY

(71) Applicant: GRUPO ANTOLÍN-INGENIERÍA, S. A., Burgos (ES)

(72) Inventors: José Ignacio Martínez Vela, Burgos (ES); Rafael García García, Burgos (ES); Javier Cadiñanos Hernando, Burgos (ES)

(73) Assignee: GRUPO ANTOLÍN-INGENIERÍA, S. A., Burgos (ES)

( * ) Notice: Subject to any disclaimer, the term of this patent is extended or adjusted under 35 U.S.C. 154(b) by 161 days.

(21) Appl. No.: 18/536,679

(22) Filed: Dec. 12, 2023

(65) Prior Publication Data

US 2024/0217341 A1  Jul. 4, 2024

(30) Foreign Application Priority Data

Dec. 29, 2022  (EP) .................................. 22383310

(51) Int. Cl.
*B60K 35/53* (2024.01)
*B60K 35/81* (2024.01)
*H05K 5/02* (2006.01)

(52) U.S. Cl.
CPC .............. *B60K 35/53* (2024.01); *B60K 35/81* (2024.01); *H05K 5/0217* (2013.01); *B60K 2360/84* (2024.01); *B60K 2360/96* (2024.01)

(58) Field of Classification Search
CPC ........ B60K 35/10; B60K 35/53; B60K 35/22; B60K 35/81; B60K 35/223; B60K 2360/84; B60K 2360/96; H05K 5/0217; B60R 11/0235; B60R 2011/0084;
(Continued)

(56) References Cited

U.S. PATENT DOCUMENTS

| | | | |
|---|---|---|---|
| 11,166,388 B2* | 11/2021 | Diboine | F16H 19/04 |
| 11,224,136 B2* | 1/2022 | Song | B60K 35/10 |
| 11,912,128 B2* | 2/2024 | Shim | B60K 35/60 |

(Continued)

FOREIGN PATENT DOCUMENTS

| | | |
|---|---|---|
| CN | 214984830 U | 12/2021 |
| DE | 102009007991 A1 | 8/2010 |

(Continued)

*Primary Examiner* — Vinh T Lam
(74) *Attorney, Agent, or Firm* — Darrell G. Mottley

(57) ABSTRACT

Vehicle interior with a retractable flexible display, providing a regulation and good integration, comprising a dashboard and a display assembly, the dashboard comprises internal fixing configurations and a top wall facing the windshield of the vehicle; the display assembly comprises two parallel guide rails, a flexible screen attached on a flexible support configured to run along the guide rails, and driving means arranged for moving the flexible support along the guide rails, each guide rail comprises a first segment, a second segment and a third segment, the first segment remains totally or partially under the top wall of the dashboard, the second segment comprises a curved portion being concave regarding the dashboard, the first segment is attached to the internal fixing configurations of the dashboard, in such a way the flexible screen can be disclosed to the vehicle interior in any extension according to its displacement along the guide rails.

11 Claims, 4 Drawing Sheets

(58) Field of Classification Search
CPC ..... B60R 2011/0082; B60R 2011/0092; B60R 2011/0005
See application file for complete search history.

(56) References Cited

U.S. PATENT DOCUMENTS

| | | | |
|---|---|---|---|
| 11,981,266 B2* | 5/2024 | Lathwesen | .......... B60R 11/0235 |
| 12,054,103 B2* | 8/2024 | Jang | ........................ G09F 9/30 |
| 2023/0131157 A1* | 4/2023 | Onogi | ................... G06F 1/1652 |
| | | | 345/156 |

FOREIGN PATENT DOCUMENTS

| | | |
|---|---|---|
| EP | 2562050 A1 | 2/2013 |
| EP | 3299205 A1 | 3/2018 |
| EP | 3848224 A1 | 7/2021 |
| EP | 4012488 A1 | 6/2022 |
| WO | 2022002723 A1 | 1/2022 |

\* cited by examiner

VEHICLE INTERIOR WITH A RETRACTABLE FLEXIBLE DISPLAY

CROSS REFERENCE APPLICATIONS

This application claims priority from European Patent Office Application 22383310 filed on Dec. 29, 2022. The entire contents of the application is incorporated herein by reference in their entirety.

FIELD OF THE INVENTION

The present invention lies in the field of arrangement or adaptations of instruments in vehicles, specifically in the field of dashboards with fittings of a display.

BACKGROUND OF THE INVENTION

A vehicle dashboard, also called cockpit or instrument panel, is a frontal garment piece covering the width of a vehicle behind the steering wheel including most of the controls and indications of the vehicle: speedometer, tachometer, fuel level, climate control, music equipment control, etc.

The use of displays, in the form of screens, is spread throughout the interior of the vehicle, becoming larger in size in order to include as much as information and control as possible. However, such large displays could be annoying for some users and in some situations, for instance, for a personal experience only a small display is desired by the user, or at night conditions where no extra bright is desired to be received by the user.

It is known a patent with publication number EP4012488A1 disclosing a flexible display device including a module housing with a curved and straight portion, having a displaceable flexible display, providing a portion of the display always visible and also a full extension of the display, with driving means in the form of two shafts with pinions engaging a support of the flexible display. The device is designed for the interior and exterior of buildings, for internal corners the user, providing a convex surface in relation to the building support.

They are also known patents disclosing rigid displays being hidden into a dashboard including complex mechanisms with rails, cam, followers, endless screws, pinions, racks, etc., like the patents with publication numbers: DE102009007991A1, EP2562050A1, EP3299205A1, CN214984830U. Furthermore, a patent with publication number EP3848224A2 discloses a flexible display translated as a block piece and being extendable laterally from both lateral sides.

It is also known a patent with publication number WO2022/002723A1 disclosing a flexible display device including a module housing with a curved and straight portion, with driving means in the form of a lever attached to the screen at its bottom section, being this device in the central console, between the seats, of a motor vehicle. The device is hidden into the central console or projected upwards to the passenger compartment.

According to the current state of the art, it is not known a dashboard with a retractable flexible display that could be included in a proper manner into the available space under the dashboard of a vehicle and is displayed in extension according to the user's own preferences.

DESCRIPTION OF THE INVENTION

The present invention is established and characterised in the independent claim, while the dependent claims describe additional characteristics thereof.

The object of the invention is to provide a vehicle interior with a retractable flexible display overcoming the drawbacks of the state of the art, providing a regulation of the screen, a good integration and adaptation to the dashboard of the vehicle.

The invention is a vehicle interior with a retractable flexible display, comprising a dashboard and a display assembly, the dashboard comprises internal fixing configurations and a top wall facing the windshield of the vehicle; the display assembly comprises two parallel guide rails, a flexible screen, like an oled panel, attached on a flexible support configured to run along the guide rails, and driving means arranged for moving the flexible support along the guide rails, as it is known in the state of the art.

The invention is characterised in that each guide rail comprises a first segment, followed by a second segment, followed by a third segment, the first segment remains totally or partially under the top wall of the dashboard, the second segment comprises a curved portion being concave regarding the dashboard, the first segment is attached to the internal fixing configurations of the dashboard, in such a way the flexible screen can be disclosed to the vehicle interior in any extension according to its displacement along the guide rails.

An advantage of the invention is the integration in a dashboard, the screen not protruding from the dashboard nor seeming like an external element to the dashboard, then gives a sight of continuity with the dashboard.

Another advantage coming from such continuity with the dashboard is that a designer is free to create an aesthetic product in a higher freedom than considering rigid screens as known in the state of the art.

Another advantage is that the display assembly occupies a relative small space, being included in an easy manner into the garments of a vehicle.

Another advantage is that gives a fully adaptability of displaying features according to the regulation of the visible screen size, for any application or any user, avoiding to show the screen constantly at any driving condition, being day, night or any other.

Another advantage is that the flexible screen with its corresponding flexible support can be moved upwards or downwards, then the starting position of the flexible screen can be in the first segment of each guide rail or in the third segment of each guide rail, being said that the display assembly is reversible regarding its movement.

Another advantage is that it can be operated manually and also can be made fully automatic, as disclosed in the detailed description here below.

BRIEF DESCRIPTION OF THE DRAWINGS

The present document is complemented with a set of drawings as an example for illustrating the preferred embodiment, and which in no way limits the invention.

DETAILED DESCRIPTION OF THE INVENTION

Figure 1:
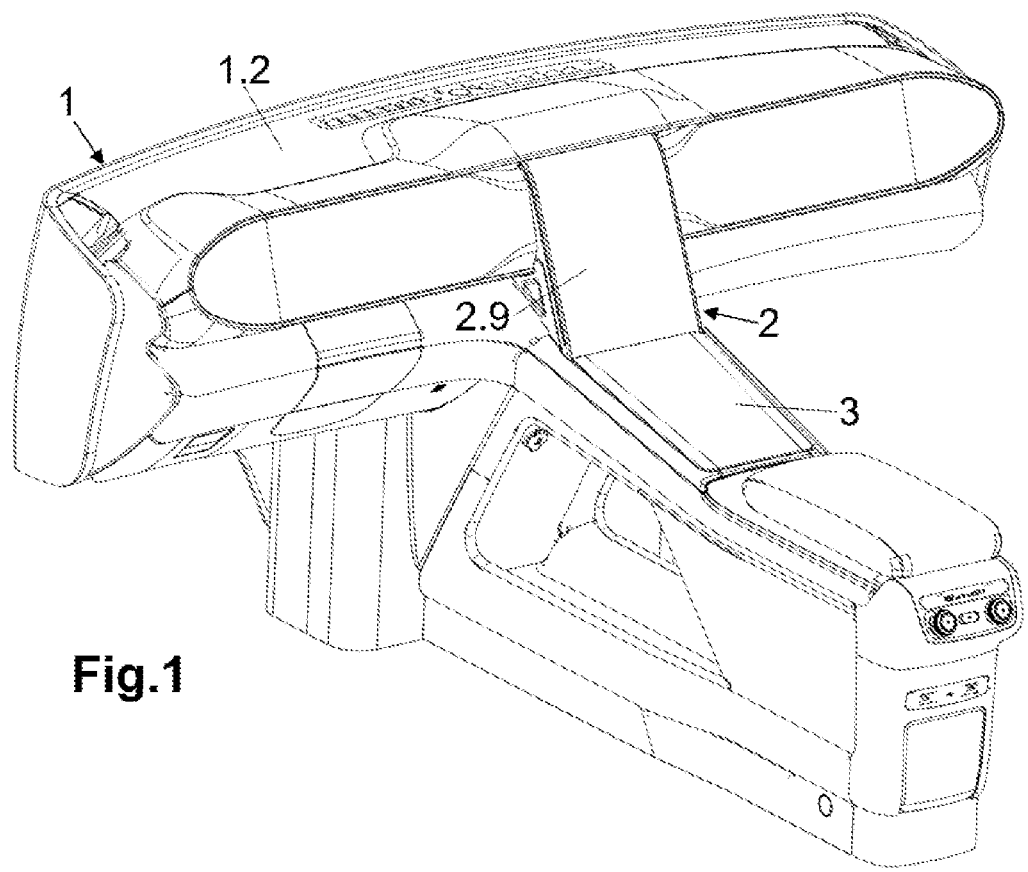
FIGS. 1 to 3 show perspective views of a vehicle interior with a retractable flexible display, with a flexible screen in a hidden position, in an intermediate position and in a fully deployed position, respectively.
Figure 2:
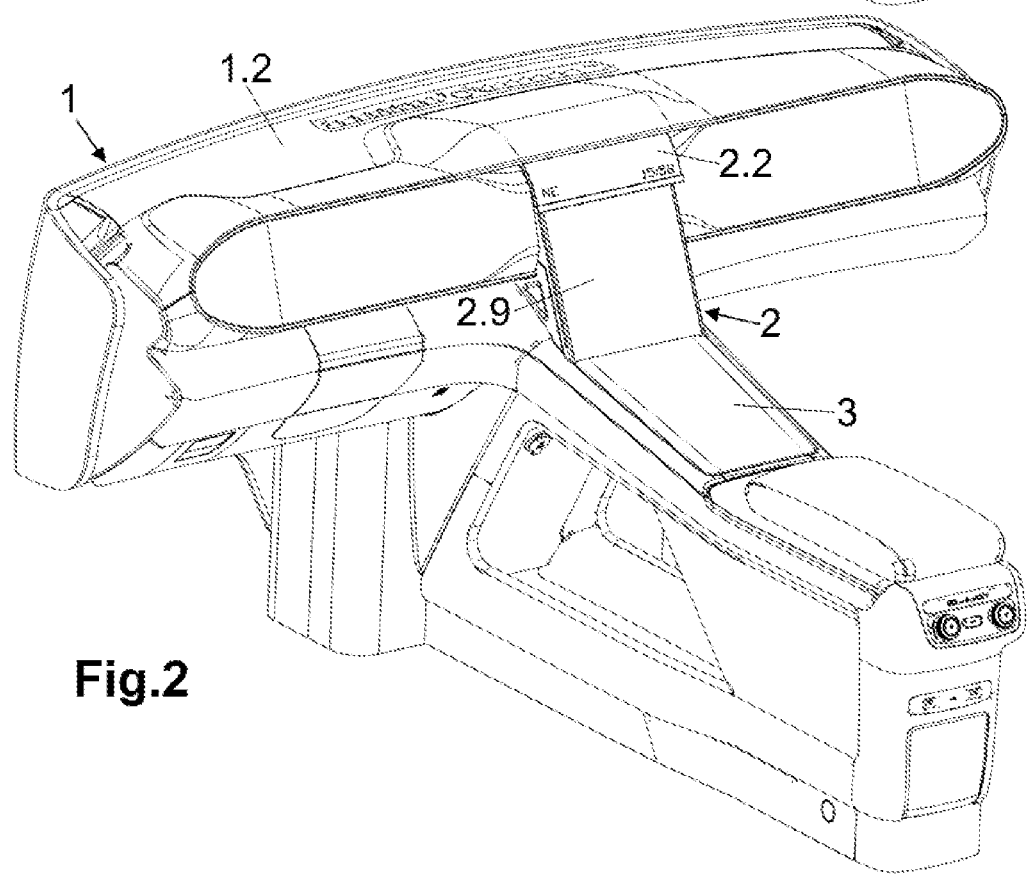
Figure 3:
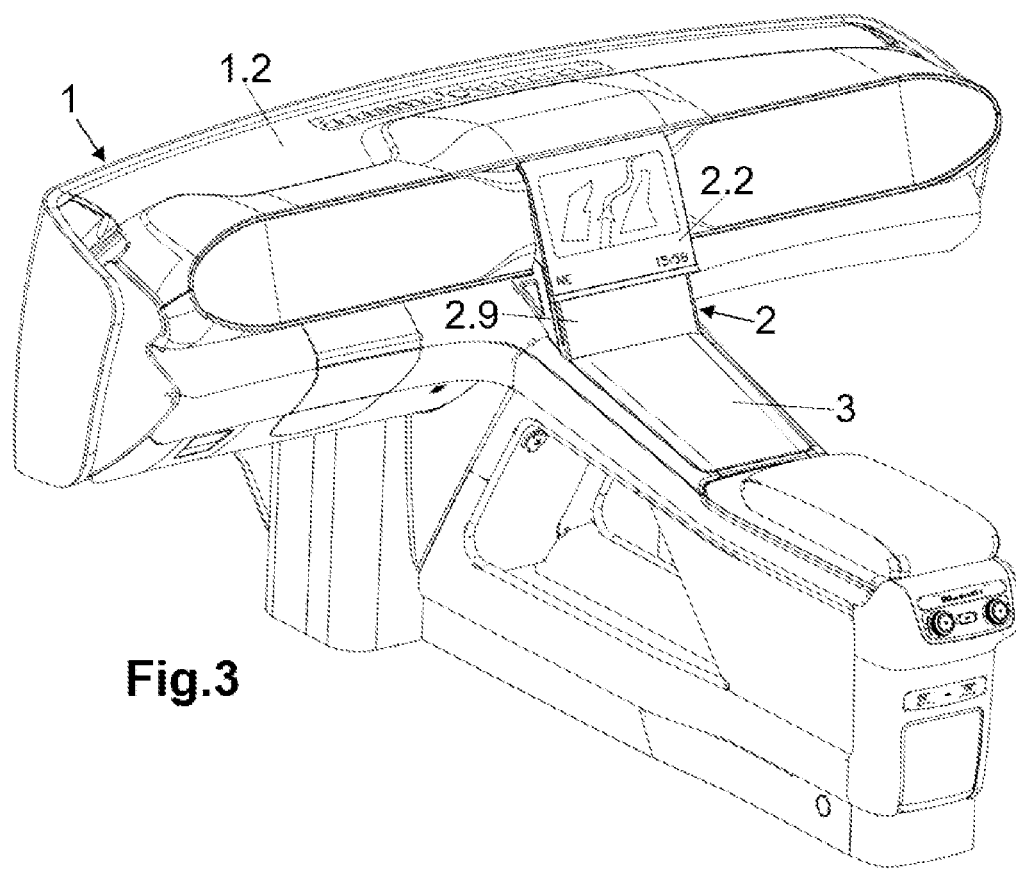
Figure 5:
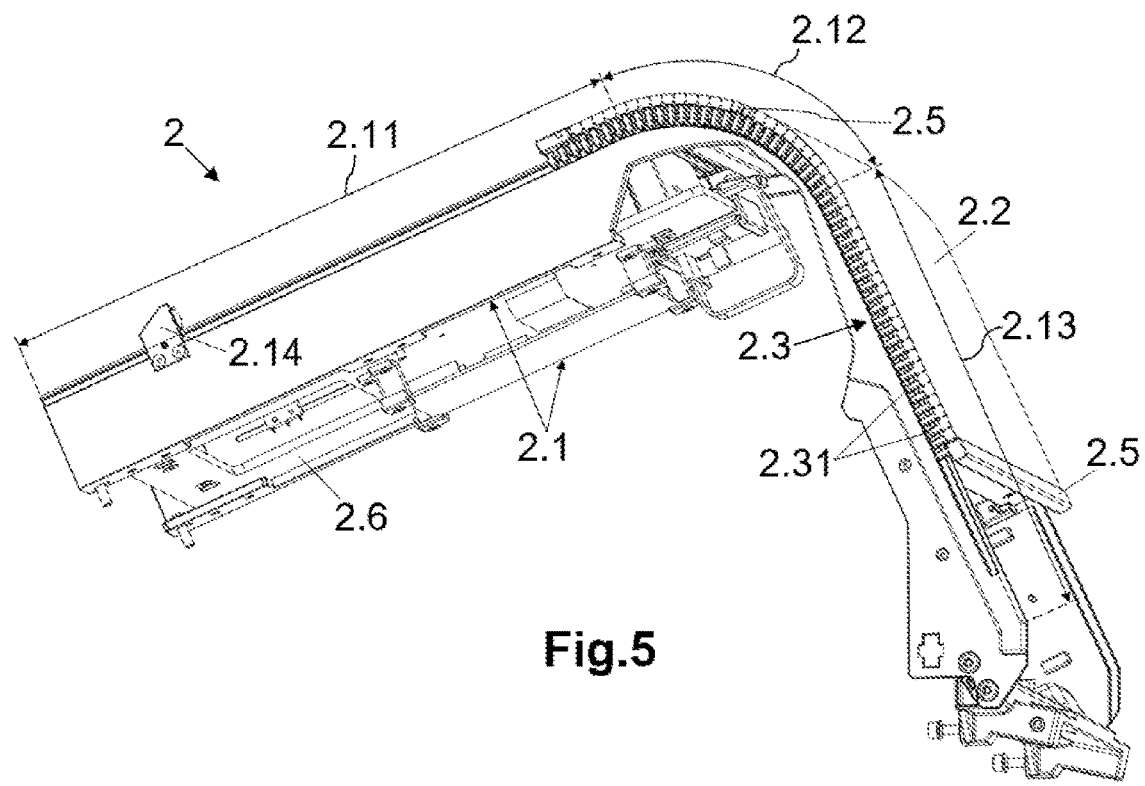
FIGS. 5 and 6 show respectively a lateral and rear perspectives views of the display assembly.
Figure 6:
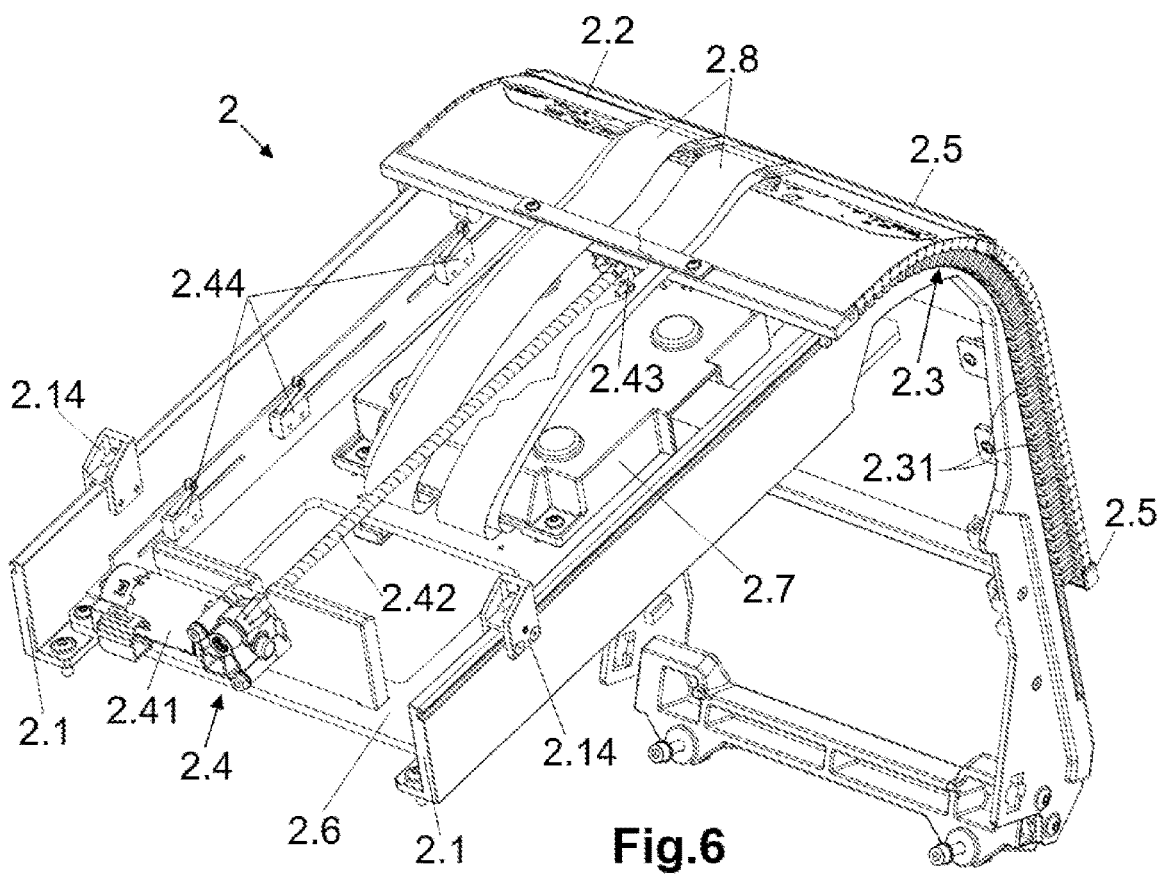

FIGS. 1 to 3 show a vehicle interior with a retractable flexible display, comprising a dashboard (1) and a display assembly (2), shown in FIGS. 5 and 6, with a flexible screen (2.2), in a hidden position in FIG. 1, in an intermediate position in FIG. 2 and in a fully deployed position in FIG. 3, showing in pictorial manner an image from a car guide navigator in FIG. 3 and some data like local time and orientation in FIGS. 2 and 3.

Figure 4:
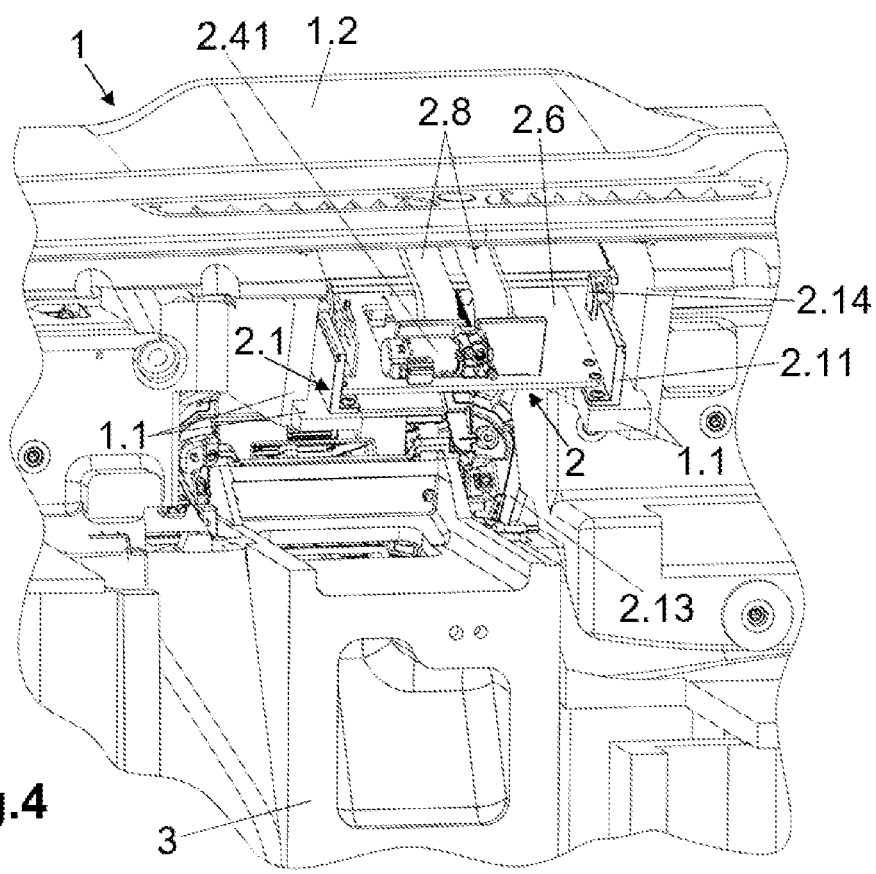
FIG. 4 shows a rear perspective view of a portion of the vehicle interior with the retractable flexible display of FIGS. 1 to 3, being the flexible screen in the position of FIG. 1.

The dashboard (1) comprises internal fixing configurations (1.1), normally in the form of walls of any shape, and a top wall (1.2) facing the windshield of the vehicle, FIG. 4; the display assembly (2) comprises two parallel guide rails (2.1), a flexible screen (2.2) attached on a flexible support (2.3) configured to run along the guide rails (2.1), and driving means (2.4) arranged for moving the flexible support (2.3) along the guide rails (2.1), FIGS. 5 and 6. In order to avoid an empty space between the guide rails (2.1) not covered by the flexible screen (2.2) in its different positions a rear cover (2.9) attached to the guide rails (2.1) can be included, FIGS. 1 to 3.

Each guide rail (2.1) comprises a first segment (2.11), followed by a second segment (2.12), followed by a third segment (2.13), FIG. 5, the first segment (2.11) remains totally under the top wall (1.2) of the dashboard (1), as shown in FIGS. 1 to 3, but can also remain partially under the top wall (1.2), depending on the specific application, the second segment (2.12) comprises a curved portion being concave regarding the dashboard (1), FIGS. 1 to 6, the first segment (2.11) is attached to the internal fixing configurations (1.1) of the dashboard (1), FIG. 4, in such a way the flexible screen (2.2) can be disclosed to the vehicle interior in any extension according to its displacement along the guide rails (2.1), FIGS. 1 to 3.

As an option, the vehicle interior also comprises a central console (3), the third segment (2.13) is attached to the dashboard (1) and/or the central console (3). In order to have a very robust attachment, the third segment (2.13) is attached to the dashboard (1) and the central console (3); however, when such attachment need not be so robust can be attached to the dashboard (1) or the central console (3), in the embodiment depicted in FIG. 4 the attachment of the third segment (2.13) is to the central console (3).

Figure 7:
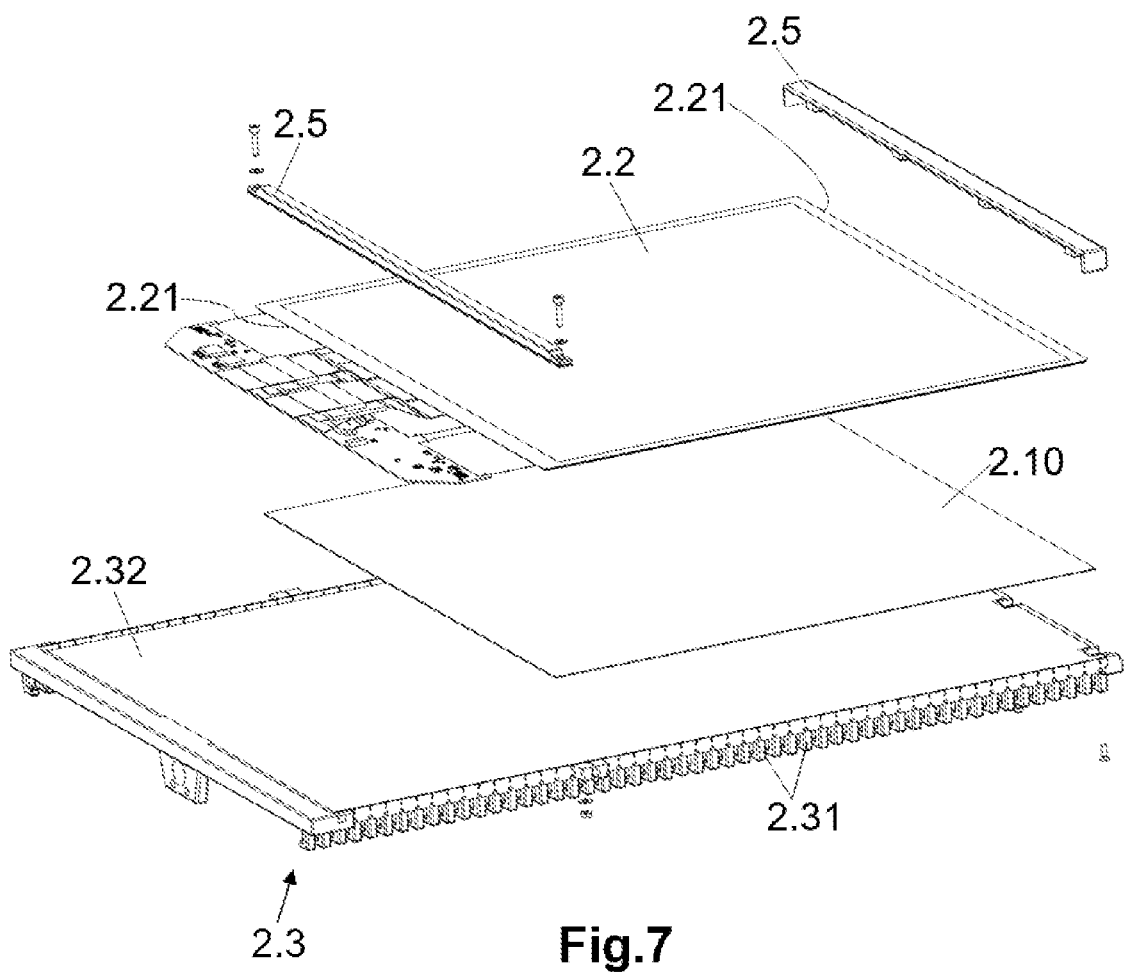
FIG. 7 shows an exploded view of the flexible screen and the flexible support.

Another option is that the flexible support (2.3) comprises at least two elongated elements (2.31) arranged consecutively and a film (2.32) attached to the elongated elements (2.31) flat providing a surface, in the embodiment of the FIGS. 5 to 7 a lot of elongated elements (2.31) are included, as ribs fixed in flexible manner one each other by its longest edges and the film (2.32) in plastic is attached being overmoulded injected on the elongated elements (2.31) as an advantageous manufacturing option but any other is possible like being a separated film attached by, for instance, adhesive or mechanical means, not represented in the figures; the flexible screen (2.2) is attached to such film (2.32) by an adhesive; the flexible screen (2.2) comprises two opposite edges (2.21), each edge (2.21) being attached to the flexible support (2.3) by a clamping bracket (2.5) providing a mechanical fixation joining the flexible screen (2.2) and the flexible support (2.3), in FIG. 7 with an exploded view with the components here above noted, in FIGS. 5 and 6 in a use configuration. The at least two elongated elements (2.31) provide a flexible and adaptable configuration to curves in the vehicle interior, and provide with the film (2.32) a flat surface whereon the flexible screen (2.2) can be attached avoiding any surface defects that could annoy any displaying session, then the film (2.32) as a coating provides such flat surface, and the attachment of the flexible screen (2.2) need to be as flexible as giving the proper adaptation to the curves mentioned here above, then the adhesive provides such effect avoiding any visual defect, and to prevent a detachment at these edges clamping brackets (2.5) are included.

The adhesive can be a double-sided adhesive tape (2.10), as depicted in FIG. 7, a sprayed adhesive, a combination of them or any other kind of adhesive suitable for the application herein described.

Furthermore, a plate (2.6) can be attached to the guide rails (2.1), electronic control means (2.7) of the flexible screen (2.2) are attached to said plate (2.6), electric conductors (2.8) are connected to the electronic control means (2.7) and to the flexible screen (2.2), FIG. 6, providing a static and solid attachment of the electronic components for the flexible screen (2.2). Also, such electronic components can be included in the flexible screen (2.2), not shown in figures, but the assembly is more complex and subjected to collisions.

Another option is that the driving means (2.4) comprise a motor (2.41) connected to an endless screw (2.42) connected to a nut (2.43) attached fixedly to the flexible support (2.3), the motor (2.41) being configured to rotate clockwise and anti-clockwise in such a way the endless screw (2.42) can move forwards and backwards the nut (2.43), then moving the flexible support (2.3) with the flexible screen (2.2) forwards and backwards along the guide rails (2.1), FIG. 6, one of the electric conductors (2.8) is partially cut-off to show the nut (2.43). This solution provides a robust configuration with very well-known components, being simple and not expensive. Another similar solution can be included, like a push-pull bar instead of the endless screw providing an alternate movement.

Besides, a plate (2.6), the same or a different one from such mentioned above, can be attached to the guide rails (2.1), the motor (2.41) is attached to said plate (2.6), FIG. 6, then providing a static and robust attachment of the motor (2.41), which is subjected to mechanical stress in some degree.

Another option is that the driving means (2.4) include a position rotation sensor in the motor (2.41) configured to provide a regulation in the extension of the flexible support (2.3), not shown in the figures. Such position rotation sensor, normally known as Hall sensor, is a liable and very well-known component providing an easy and accurate regulation. Also another alternative is that the driving means (2.4) includes a processor with a software configured to provide a regulation in the extension of the flexible support (2.3), not shown in the figures, in this manner a fully programmable option can be used to adapt the functioning of the movement in a very customizable manner. And also another alternative is that the driving means (2.4) includes a switching unit, operable by a user and not shown in the figures, configured to activate the motor (2.41) to rotate clockwise and anti-clockwise, providing a very simple and cheap configuration, which could be enough for some applications.

Another option is that the guide rails (2.1) include end blocks (2.14) arranged for stopping the flexible support (2.3), FIGS. 5 and 6. A mechanical and strong stop is then provided, avoiding any risk of running out of the guide rails (2.1).

Another option that could be implemented in any of the driving means (2.4) options disclosed here above is to include position stopper means (2.44), like micro-switches, arranged in at least one guide rail (2.1) for contacting to the flexible support (2.3). These are very well-known elements that can be also disposed at any desired location to provide any position of the flexible support (2.3).

The display assembly (2) is said to be reversible, specifically regarding the movement of the flexible support (2.3) with the flexible screen (2.2), that is, the starting position can be in the first segment (2.11) or in the third segment (2.13) of each guide rail (2.1), and then moving upwards or downwards. The details mentioned here above in this section of this document are valid for both considerations; in detail, for instance considering the options of driving means (2.4), the endless screw (2.42) could be a flexible one when the starting position was on the third segment (2.13) and placed on a side near a guide rail (2.1) to keep as hidden as possible from a user's field of view.

The invention claimed is:

1. A Vehicle interior with a retractable flexible display, comprising a dashboard (1) and a display assembly (2); the dashboard (1) comprises internal fixing configurations (1.1) and a top wall (1.2) facing the windshield of the vehicle; the display assembly (2) comprises two parallel guide rails (2.1), a flexible screen (2.2) attached on a flexible support (2.3) configured to run along the guide rails (2.1), and driving means (2.4) arranged for moving the flexible support (2.3) along the guide rails (2.1), characterised in that each guide rail (2.1) comprises a first segment (2.11), followed by a second segment (2.12), followed by a third segment (2.13), the first segment (2.11) remains totally or partially under the top wall (1.2) of the dashboard (1), the second segment (2.12) comprises a curved portion being concave regarding the dashboard (1), the first segment (2.11) is attached to the internal fixing configurations (1.1) of the dashboard (1), in such a way the flexible screen (2.2) can be disclosed to the vehicle interior in any extension according to its displacement along the guide rails (2.1).

2. The Vehicle interior with a retractable flexible display according to claim 1, wherein the vehicle interior also comprises a central console (3), the third segment (2.13) is attached to the dashboard (1) and/or the central console (3).

3. The Vehicle interior with a retractable flexible display according to claim 1, wherein the flexible support (2.3) comprises at least two elongated elements (2.31) arranged consecutively and a film (2.32) attached to the elongated elements (2.31) providing a flat surface; the flexible screen (2.2) is attached to such film (2.32) by an adhesive; the flexible screen (2.2) comprises two opposite edges (2.21), each edge (2.21) being attached to the flexible support (2.3) by a clamping bracket (2.5) providing a mechanical fixation joining the flexible screen (2.2) and the flexible support (2.3).

4. The Vehicle interior with a retractable flexible display according to claim 1, wherein a plate (2.6) is attached to the guide rails (2.1), electronic control means (2.7) of the flexible screen (2.2) are attached to said plate (2.6), electric conductors (2.8) are connected to the electronic control means (2.7) and to the flexible screen (2.2).

5. The Vehicle interior with a retractable flexible display according to claim 1, wherein the driving means (2.4) comprise a motor (2.41) connected to an endless screw (2.42) connected to a nut (2.43) attached fixedly to the flexible support (2.3), the motor (2.41) being configured to rotate clockwise and anti-clockwise in such a way the endless screw (2.42) can move forwards and backwards the nut (2.43), then moving the flexible support (2.3) with the flexible screen (2.2) forwards and backwards along the guide rails (2.1).

6. The Vehicle interior with a retractable flexible display according to claim 5, wherein a plate (2.6) is attached to the guide rails (2.1), the motor (2.41) is attached to said plate (2.6).

7. The Vehicle interior with a retractable flexible display according to claim 5, wherein the driving means (2.4) include a position rotation sensor in the motor (2.41) configured to provide a regulation n the extension of the flexible support (2.3).

8. The Vehicle interior with a retractable flexible display according to claim 5, wherein the driving means (2.4) includes a processor with a software configured to provide a regulation in the extension of the flexible support (2.3).

9. The Vehicle interior with a retractable flexible display according to claim 5, wherein the driving means (2.4) includes a switching unit operable by a user and configured to activate the motor (2.41) to rotate clockwise and anti-clockwise.

10. The Vehicle interior with a retractable flexible display according to claim 5, wherein the guide rails (2.1) include end blocks (2.14) arranged for stopping the flexible support (2.3).

11. The Vehicle interior with a retractable flexible display according to claim 4, wherein the driving means (2.4) include position stopper means (2.44) arranged in at least one guide rail (2.1) for contacting to the flexible support (2.3).

* * * * *